United States Patent
Chen (10) Patent No.: US 11,233,605 B2
(45) Date of Patent: Jan. 25, 2022

(54) METHOD AND APPARATUS FOR CODING AND DECODING POLAR CODES (71) Applicant: Alcatel Lucent, Nozay (FR)

(72) Inventor: Yu Chen, Shanghai (CN)

(73) Assignee: ALCATEL LUCENT, Nozay (FR)

(*) Notice: Subject to any disclaimer, the term of this patent is extended or adjusted under 35 U.S.C. 154(b) by 0 days.

(21) Appl. No.: 16/323,577

(22) PCT Filed: Aug. 14, 2017

(86) PCT No.: PCT/IB2017/001237
§ 371 (c)(1),
(2) Date: Feb. 6, 2019

(87) PCT Pub. No.: WO2018/029542
PCT Pub. Date: Feb. 15, 2018

(65) Prior Publication Data
US 2019/0207712 A1 Jul. 4, 2019

(30) Foreign Application Priority Data
Aug. 12, 2016 (CN) .......................... 201610667785.7

(51) Int. Cl.
H04L 1/00 (2006.01)
H03M 13/29 (2006.01)
(Continued)

(52) U.S. Cl.
CPC .......... H04L 1/0058 (2013.01); H03M 13/13 (2013.01); H03M 13/2906 (2013.01);
(Continued)

(58) Field of Classification Search
CPC ... H04L 1/0058; H04L 1/0041; H04L 1/0045; H04L 1/0065; H04L 1/08; H03M 13/13; H03M 13/2906
See application file for complete search history.

(56) References Cited

U.S. PATENT DOCUMENTS

2015/0103947 A1* 4/2015 Shen ............... H04L 1/0056
375/295
2016/0013810 A1* 1/2016 Gross ............... H03M 13/451
714/776
(Continued)

FOREIGN PATENT DOCUMENTS

CN 102122966 A 7/2011
CN 102164025 A 8/2011
(Continued)

OTHER PUBLICATIONS

Seidl, M., et al., "Aspects of Polar-Coded Modulation", SCC 2013; 9th International ITG Conference on Systems, Communication and Coding, Conference Location: München, Deutschland, Date of Conference: Jan. 21-24, 2013, pp. 1-6. (Year: 2013).*

(Continued)

Primary Examiner — Kyle Vallecillo
(74) Attorney, Agent, or Firm — Fay Sharpe LLP (57) ABSTRACT The present disclosure provides optimized coding and decoding methods for polar codes and corresponding encoder and decoder. The coding method comprises: providing to-be-encoded input bits that include free bits and remaining bits; dividing the remaining bits into a plurality of fragments; providing a connection code; connecting one fragment of the remaining bits to the connection code to thereby form a connected fragment, while the remaining being still unconnected fragments; performing polarization coding to the free bits, the connected fragment, and the unconnected fragments to obtain the polar codes.

9 Claims, 6 Drawing Sheets (51) Int. Cl.
*H03M 13/13* (2006.01)
*H04L 1/08* (2006.01)

(52) U.S. Cl.
CPC .......... *H04L 1/0041* (2013.01); *H04L 1/0045* (2013.01); *H04L 1/0065* (2013.01); *H04L 1/08* (2013.01)

(56) References Cited

U.S. PATENT DOCUMENTS

| | | | | |
|---|---|---|---|---|
| 2016/0308644 | A1* | 10/2016 | Shen | H03M 13/6362 |
| 2017/0126354 | A1* | 5/2017 | Marsland | H04L 1/0041 |
| 2019/0215133 | A1* | 7/2019 | Pan | H04L 1/0003 |

FOREIGN PATENT DOCUMENTS

| | | | |
|---|---|---|---|
| CN | 103516476 | A | 1/2014 |
| CN | 105009461 | A | 10/2015 |
| CN | 107733562 | | 2/2018 |
| EP | 2 849 377 | A1 | 3/2015 |
| EP | 2 899 911 | A1 | 7/2015 |
| WO | WO 2014/092502 | A1 | 6/2014 |

OTHER PUBLICATIONS

Huayi Zhou et al., "Segmented CRC-Aided SC List Polar Decoding," $83^{rd}$ Vehicular Technology Conference, IEEE, pp. 1-5, XP032918751, 2016.

Jianfeng Guo et al., "Multi-CRC Polar Codes and Their Applications," IEEE Communications Letter, vol. 20, No. 2, pp. 212-215, XP011598246, 2016.

Nokia et al., "Performance of mMTC and URLLC channel coding candidates," $3^{rd}$ Generation Partnership Project (3GPP), 3GPP TSG-RAN WG1 #85, R1-165358, 10 pages, Nanjing, P.R. China, May 23-27, 2016.

Erdal Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, Jul. 2009.

International Search Report for PCT/IB2017/001237 dated Feb. 5, 2018.

* cited by examiner

METHOD AND APPARATUS FOR CODING AND DECODING POLAR CODES

FIELD OF THE INVENTION

The present disclosure relates to coding and decoding polar codes, and more particularly to a method and apparatus for coding and decoding polar codes suitable for small packet transmission.

BACKGROUND OF THE INVENTION

Machine Type Communication (MTC) is one of the most important topics in 5G. MTC UEs (User Equipment) are often those simple and battery driven devices, so the complexity and battery life are the critical issues to support this kind of service.

Polar codes were first proposed by Professor Erdal Arikan from the University of Bilken, Turkey, in his paper "Channel polarization: a method for constructing capacity achieving codes for symmetric binary-input memoryless channels" submitted and released in 2007, which theoretically proved that the polar codes could reach the Shannon capacity with an extremely low coding and decoding complexity (only 1.5% of the Turbo codes according to studies) in a symmetrical binary-input discrete memoryless channel. The entirety of this paper is incorporated here by reference and should be regarded as being recorded in the description of the present application.

Therefore, the polar codes are defined as a candidate coding scheme for 5G, especially for 5G MTC.

However, the polar codes only have a barely satisfactory performance for small packets (e.g., within 100 bytes (including, but not limited to, dozens of bits), though probably still better than some other coding schemes. A proof of this is that a gap still exists between their actual decoding performance and the theoretical value. The reason is that the polar codes are built on a channel polarization theory, where an equivalent channel is modelled to include a decoder. After the decoding, the bits parallel inputted into the encoder will experience a channel polarization effect, i.e., different bits experience different channel capacities. Ideally, some bits will experience error free channels while the others will experience zero capacity channels. The detailed theories about polar codes and channel polarization can be found in this paper of professor Arikan.

Figure 1:
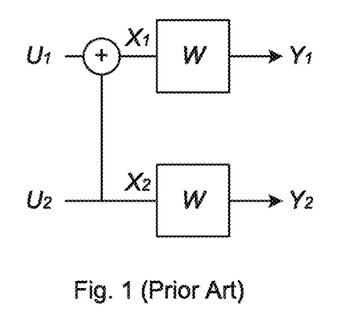
FIG. 1 illustrates a schematic diagram of a polar code encoder with the simplest configuration.

FIG. 1 shows an example of a polar code encoder with the simplest configuration. In this example, W denotes a channel, $U=[U_1, U_2]$ denotes inputted bits, and $X=[X1, X2]$ denotes coded output bits (here, the coded output bits are also referred to as coded bits). So, channel mutual information is expressed as $I(Y;U)=I(Y;X)$, and $I(U_1, U_2; Y_1, Y_2)=I(X_1, X_2; Y_1, Y_2)=2I(W)$.

Channel polarization is conducted by two steps: channel combining and channel splitting. The channel combining forms a combined channel $W_N$, while channel splitting is a process of re-forming N virtual channels based on the combined channel $W_N$. This is based on the theory expressed below: $I(U_1, U_2; Y_1, Y_2)=I(U_1; Y_1, Y_2)+I(U_1; Y_1, Y_2, U_1)$. So, in this example, the split channels are $W^-(y1, y2|u1)$, and $W^+(y_1, y_2, u_1|u_2)$; besides, $I(W^+)+I(W^-)=2I(W)$, $I(W^+) > I(W^-)$. This is the so-called polarization effect. As show in FIG. 2, for a very large packet on a binary erasure channel (BEC) (e.g., the $2^{20}$-sized code block in the rightmost of FIG. 2), an ideal channel polarization can be achieved.

Figure 2:
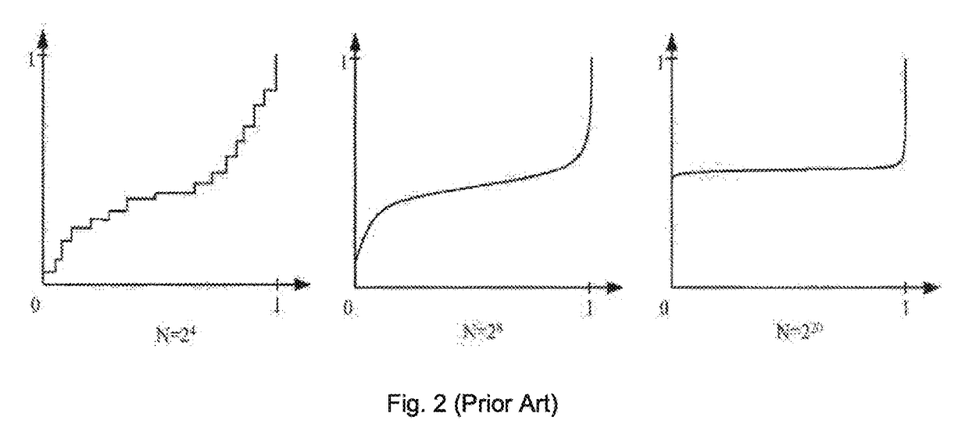
FIG. 2 illustrates a channel polarization effect according to a prior art on a binary erasure channel.
Figure 3:
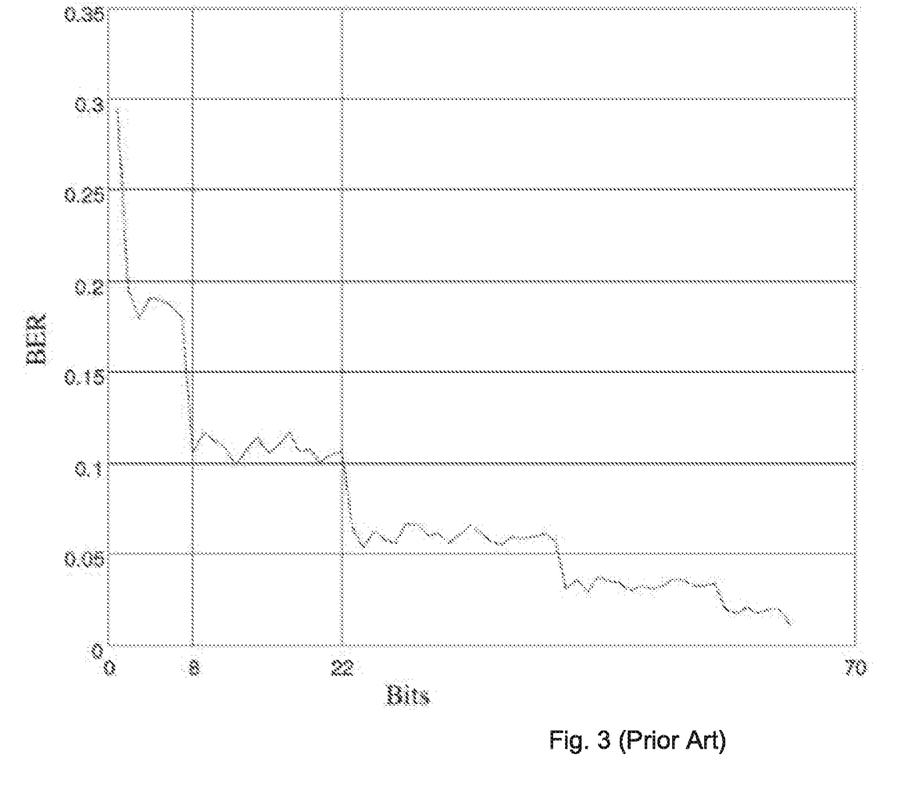
FIG. 3 illustrates a channel polarization effect according to a prior art on an Additive White Gaussian Noise channel.
Figure 4:
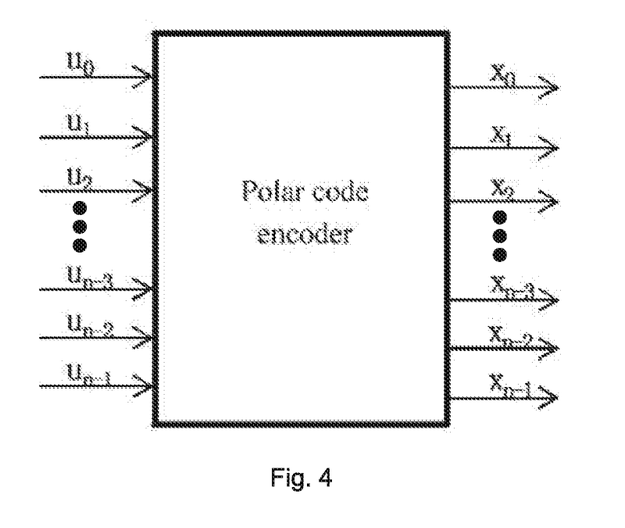
FIG. 4 is a schematic diagram of an encoder in the example of FIG. 3, in which the encoder receives as input a plurality of input bits $U_0, U_1, U_2, \ldots, U_{n-3}, U_{n-2}, U_{n-1}$, and generates therefrom coded output bits $X_0, X_1, X_2, \ldots X_{n-3}, X_{n-2}, X_{n-1}$.

However, for a smaller code block (e.g., the $2^4$-sized code block shown in the leftmost of the figure), a relatively ideal channel polarization cannot be achieved, which is also shown in FIG. 2. The BER (Bit Error Rate) performance in the AWGN (Additive White Gaussian Noise) channel shown in FIG. 3 shows that the non-ideal polarization effect in the AWGN channel is more severe than in BEC channel.

Ideally, the split channels with zero capacity are for frozen bits, while the channels with high capacity are for free bits. Then, the code rate is $R=N_{frozen\_bits}/(N_{frozen\_bits}+N_{free\_bits})$. Through polarization, the split channels are mutually independent and the BLER (Block Error Rate) may be estimated by $$BLER = 1 - \prod_{i=1}^{N_{free\_bits}} (1 - BER_i).$$

However, in practice, the bit channels other than those for free bits are not really of zero capacity for smaller packets; instead, their capacities are quite large, though still lower than those of the channels carrying the free bits. This means a waste in channel capacities if they are not used. However, if these channels are used for carrying free bits, a corresponding problem will arise, i.e., the decoder cannot correctly decode due to an extremely high bit error rate existent on these channels.

SUMMARY OF THE INVENTION

According to the embodiments of the present disclosure, it is desired to provide a novel solution for coding and decoding polar codes, which is particularly advantageous in transmitting smaller packets, because it may effectively utilize the channels that were once believed to have a too smaller capacity and thus provides a higher channel capacity for transmitting the smaller packets; meanwhile and more importantly, it is desired not to significantly increase coding or decoding complexity.

An embodiment according to an aspect of the present disclosure provides a method for coding polar codes, comprising: providing to-be-encoded input bits that include free bits and remaining bits; dividing the remaining bits into a plurality of fragments; providing a connection code; connecting one fragment of the remaining bits to the connection code to thereby form a connected fragment, while the remaining being still unconnected fragments; performing polarization coding to the free bits, the connected fragment, and the unconnected fragments to obtain the polar codes.

Optionally, the unconnected fragments are configured to transmit and receive a preset bit known to both parties (e.g., 0) upon polarization coding.

Optionally, a length of the fragment connected to the connection code is smaller than the free bit.

Optionally, a length of the connection code is smaller than a total length of the input bits.

Optionally, in step b, bit error rates of different bits in each fragment are substantially identical, the connection code is configured to reduce the bit error rate of the fragment connected therewith, and the connection code does not need cyclic redundancy check.

The bit error rate of the connected fragment is no higher than a lowest bit error rate of the free bits.

According to an embodiment of another aspect of the present disclosure, there is provided a method of decoding polar codes, comprising: receiving a coded codeword from a transmitting end, the coded codeword being generated by coding to-be-coded input bits via a connection code and polar codes; decoding the coded codeword to restore the input bits.

Optionally, the method comprises: receiving an indication from the transmitting end, the indication being for informing any one of the following items: whether the transmitting end uses the connection code to code the polar codes; how many fragments the remaining bits other than free bits in the input buts are divided at the transmitting end; whether each of the fragments is connected to the connection code; a type and relevant configuration parameters of the connection code; a code rate of the connection code; a composing/interleaving scheme of each fragment.

According to an embodiment of a still further aspect of the present disclosure, there is provided an encoder for polar codes, comprising: a first unit configured to provide to-be-encoded input bits that include free bits and remaining bits; a second unit configured to divide the remaining bits into a plurality of fragments; a third unit configured to provide a connection code; a fourth unit configured to connect one fragment of the remaining bits to the connection code to thereby form a connected fragment, while the remaining being still unconnected fragments; a fifth unit configured to perform polarization coding to the free bits, the connected fragment, and the unconnected fragments to obtain the polar codes.

Optionally, the unconnected fragments are configured to transmit and receive a preset bit known to both parties (e.g., 0) upon polarization coding.

Optionally, a length of the fragment connected to the connection code is smaller than the free bit.

Optionally, a length of the connection code is smaller than a total length of the input bits.

Optionally, bit error rates of different bits in each fragment are substantially identical.

Optionally, the third unit is configured to provide a plurality of different connection codes; and the fourth unit is configured to connect a plurality of different connection codes with a plurality of different fragments of the remaining bits to form a plurality of connected fragments, while the remaining are unconnected fragments, and wherein the connection codes are configured to reduce the bit error rate of the fragments connected therewith, and the connection codes need no cyclic redundancy check.

Optionally, the bit error rate of any of the connected fragments is no higher than a lowest bit error rate of the free bits.

According to an embodiment of a yet further aspect of the present disclosure, there is provided a decoder for polar codes, comprising: a sixth unit configured to receive a coded codeword from a transmitting end, the coded codeword being generated by coding to-be-coded input bits via a connection code and the polar codes; and a seventh unit configured to decode the coded codeword to restore the input bits.

Optionally, the decoder further comprises: an eighth unit configured to receive an indication from the transmitting end, the indication being for informing any one of the following items: whether the transmitting end uses a connection code to code the polar codes; how many fragments the remaining bits other than free bits in the input buts are divided at the transmitting end; whether each of the fragments is connected to the connection code; type and relevant configuration parameters of the connection code; code rate of the connection code; a composing/interleaving scheme of each fragment.

Compared with the prior art, the embodiments of the present disclosure have the following advantages: 1. With an MTC as an example, channel capacities when transmitting smaller packets with the polar code are enhanced; 2. The error rate (bit error rate or block error rate) is not compromised; 3. The decoding complexity of the polar codes is maintained at an extremely low degree; 4. The coding complexity is very low and has a good scalability, thereby supporting different packet sizes and coding matrices.

BRIEF DESCRIPTION OF THE
ACCOMPANYING DRAWINGS

Other features, objectives and advantages of the present disclosure will become more apparent through reading the detailed depiction of the non-limiting embodiments with reference to the accompanying drawings.

Throughout the drawings, the same or corresponding reference numerals represent the same or corresponding parts.

DETAILED DESCRIPTION OF THE
PREFERRED EMBODIMENTS

Before discussing the exemplary embodiments in more details, it should be noted that some exemplary embodiments are described as processes or methods depicted as flow diagrams. Although the flow diagrams describe various operations as sequential processing, many operations therein may be implemented in parallel, concurrently or simultaneously. Besides, the sequence of various operations may be re-arranged. When the operations are completed, the processing may be terminated; besides, there may also include additional steps that are not included in the drawings. The processing may correspond to a method, a function, a specification, a sub-routine, a sub-program, etc.

The "computer device" herein (also referred to as "the computer") refers to a smart electronic device that may execute a predetermined processing process such as numerical computation and/or logic computation by running a predetermined program or instruction, which may comprise a processor and a memory, wherein the processor executes a program instruction prestored in the memory to execute the predetermined processing process, or executes the predetermined processing process using hardware such as ASIC, FPGA, and DSP, or executes by the combination of the two above. The computer device includes, but not limited to, a server, a personal computer (PC), a laptop computer, a tablet computer, a smart phone, and etc.

The computer device for example includes a user equipment and a network device. Particularly, the user equipment includes, but not limited to, a personal computer (PC), a laptop computer, and a mobile terminal, etc.; the mobile terminal includes, but not limited to, a smart phone, a PDA, and etc.; the network device includes, but not limited to, a single network server, a server group consisting of a plurality of network servers, or a cloud consisting a large number of computers or network servers based on cloud computing, wherein the cloud computing is a kind of distributed computing, i.e., a hypervisor consisting of a group of loosely coupled computer sets. Particularly, the computer device may operate to implement the present disclosure individually or may access to a network to implement the present disclosure through an interactive operation with other computer devices in the network. Particularly, the network where the computer device is located includes, but not limited to, the Internet, a Wide Area Network, a Metropolitan Area Network, a Local Area Network, a VPN network, etc.

It needs to be noted that the user equipment, network device, and network here are only examples, and other existing or future possibly emerging computer devices or networks, if applicable to the present disclosure, but also may be included within the protection scope of the present disclosure, which are incorporated here by reference.

The methods that will be discussed infra (some of which will be illustrated through flow diagrams) may be implemented through hardware, software, firmware, middleware, microcode, hardware descriptive language or any combination thereof. When they are implemented using software, firmware, middleware or microcode, the program codes or code segments for implementing essential tasks may be stored in a computer or computer readable medium (e.g., storage medium). (One or more) processors may implement essential tasks.

The specific structures and functional details disclosed here are only representative and intended to describe the exemplary embodiments of the present disclosure. Further, the present disclosure may be specifically implemented by a plurality of alternative modes and should not be construed to being only limited to the embodiments illustrated herein.

It should be understood that although terms like "first" and "second" may be used here to describe respective units, these units should not be limited by these terms. Use of these terms are only for distinguishing one unit from another unit. For example, without departing from the scope of exemplary embodiments, a first unit may be referred to as a second unit, and likewise the second unit may be referred to as the first unit. The term "and/or" used here includes any and all combinations of one or more associated items as listed.

It should be understood that when a unit is referred to being "connected" or "coupled" to another unit, it may be directly connected or coupled to said another unit, or a medium unit may exist. In contrast, when a unit is referred to being "directly connected" or "directly coupled" to another unit, a medium unit does not exist. Other expressions (e.g., "located between . . . " vs. "directly located between . . . ," and "adjacent to . . . " vs. "directly adjacent to . . . ," etc.) for describing a relation between units should be construed in a similar manner.

The term used here is only for describing preferred embodiments, not intended to limit the exemplary embodiments. Unless otherwise indicated, a singular form "a(n)" or "one" used here is also intended to cover plurality. It should also be understood that the terms "comprise" and/or "include" as used here limit the presence of features, integers, steps, operations, units and/or components as stated, but do not exclude presence or addition of one or more other features, integers, steps, operations, units, components and/or combinations.

It should also be mentioned that in some alternative implementations, the functions/actions as mentioned may occur according to the sequences different from what are indicated in the drawings. For example, dependent on the functions/actions as involved, two successively indicated diagrams actually may be executed substantially simultaneously or sometimes may be executed in a reverse order.

According to an embodiment of the present disclosure, one of its basic ideas is to use a shorter connection code to connect a fragment of the remaining bits other than the free bits of the input bits. This connection code preferably has a length shorter than the input bits, and its coded output is only connected to a portion of the input puts. Then, the remaining bits in the input bits are split according to a BER, forming a plurality of fragments.

For a specific MCS, the free bits and the remaining bits in the input bits may be obtained. For the remaining bits, its BER or channel mutual information may be obtained based on statistics or calculation. The BERs or channel mutual information of the remaining bits follow a stepped structure as shown in FIG. 3; then based on such a structure, different fragments of the remaining bits may be defined, the bits in each fragment having a similar BER performance.

A shorter connection code is for being connected to at least one of these fragments so as to improve BER performance of the fragments upon polarization coding. In one example, a duplicate code may be used. For a specific code, the decoding performance is known, mainly determined by a code rate; then the code rate is designed such that the BER of a connected fragment formed by the connection code and fragments is no higher than the worst BER of the free bits without using the connection code.

Specifically, different fragments may be connected to different connection codes. The code rates of different fragments are configured based on their BERs. Therefore, their codes are not necessarily identical, usually smaller than 1. The above-mentioned unconnected fragments of the remaining bits without being connected with the connection code are set as a preset bit known to both of the transmitting and receiving parties upon polarization coding, e.g., set to 0. The bits inputted for generating the connection code may be further grouped to obtain a better average BER performance. In one example, a repetition code with a code rate of ⅓ is used, wherein one bit of the polar code has a high BER, while two bits of the polar codes have a lower BER.

Optionally, the unconnected fragments are set to a preset bit known to both transmitting and receiving parties upon polarization coding, e.g., 0.

In at least one example of the present disclosure, an objective of the connection code is only to improve the BER performance of a portion of fragments of the remaining bits; therefore, these connection codes needn't have a cyclic redundancy check (CRC), which is also a major characteristic of the example of the present disclosure. Because CRC has a considerable overhead, elimination of the need of CRC for the connection codes will facilitate lowering of the decoding complexity.

In one example, the code structure (whether connection codes exist, how to split the remaining bits, and etc.) used between the transmitting and receiving ends may be fixed. In another example, such code structure may be composite, i.e., wherein one part of parameters are fixed, while the other part of parameters are dynamically determined. The signaling of the transmitting end or the network end for indicating the code structure to the receiving end may include, but not limited to, the following information: whether the connection code is used; how many fragments the remaining bits are divided into (from 1 to N); whether each fragment is connected to the connection codes; types and relevant configuration parameters of the connection codes; the code rates of connection codes; and the combining/interleaving manner of each fragment.

In one example, the information indicated in the signaling may be predefined in a definition and/or informed through a higher level signaling, e.g., RRC signaling, while the other information is dynamically informed by a DCI message. This manner is applicable for first transmission and retransmission.

At the receiving end (e.g., UE end), the receiving end receives the information and decodes the coded codeword. The receiving end may use iterative decoding, i.e., first decoding the polar codes, then decoding the connection codes, and finally decoding the polar codes. To reduce the complexity of the downlink receiving end, i.e., the decoder of the user equipment, the connection codes may be decoded using hard decision.

After decoding, the receiving party may feed back at least one of the following to the transmitting party:
 effect of the connection code;
 recommendation of using or disabling the connection code;
 preferable or supported connection code scheme;
 preferable code rate of each connection code.

Figure 9:
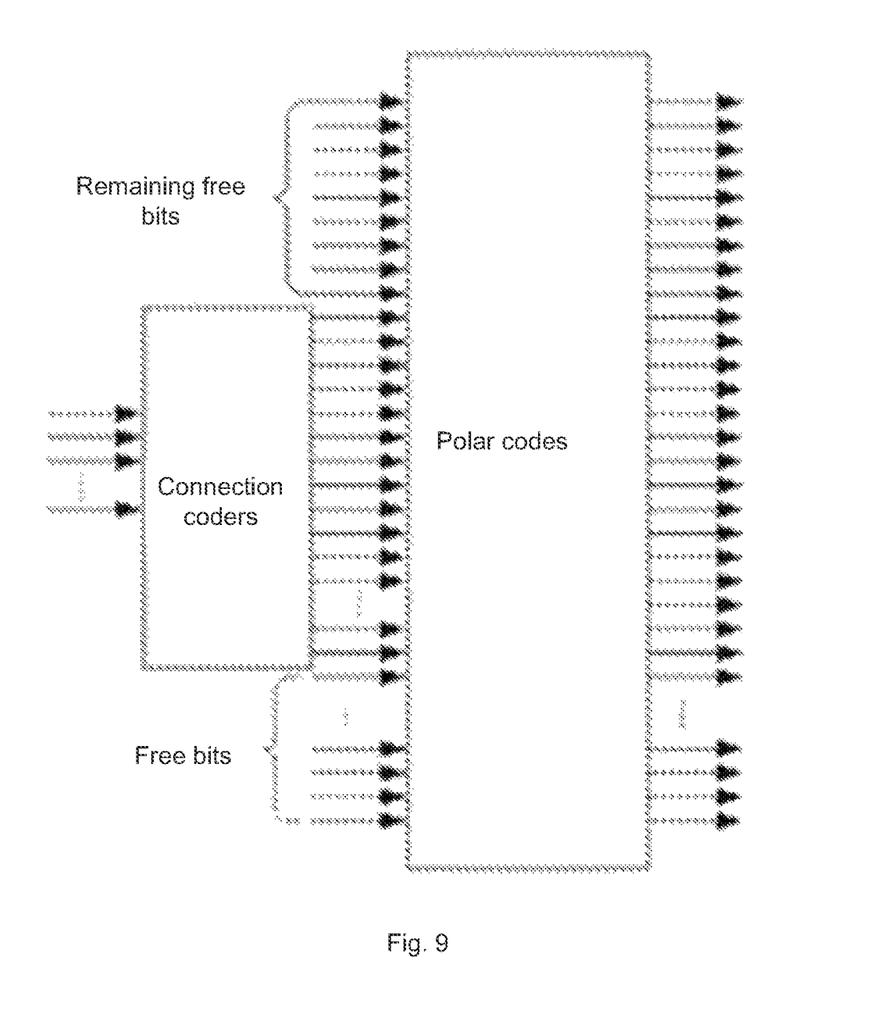
FIG. 9 is a schematic diagram of a code structure according to a preferred embodiment of the present disclosure, showing polar codes that receive as input free bits, connection codes generated by one or more connection coders, and remaining free bits, and generates polar encoded free bits therefrom in accordance with the various techniques described herein.

In one example, 64 polar codes are used, with a code rate of 0.5; the input bits include 32 free bits (hereinafter uniformly referred to as free bits) and 32 remaining bits (hereinafter uniformly referred to as remaining bits). For a specific signal-to-noise ratio, the code rate cannot be further enhanced; otherwise, the BLER will be significantly deteriorated. The code structure in this example is shown in FIG. 9.

Observation of the BER of each bit in the polar codes shows that the bits [8 . . . 22] may be regarded in the same fragment, forming a stable BER. The repetition codes may be used to transmit 5 bits, output 15 bits, and are connected to the positions of 15 input bits, i.e., input bits [8 . . . 22].

At the receiving end, the decoder attempts to decode the coded codeword using a list decoder to generate the bits using hard decision. Then, the output of the fragment (i.e., the bits [8 . . . 22] will be decoded using a repetition code decoder. The decoded bits are then used to replace the corresponding original output bits in the fragment, i.e., buts [8 . . . 22]. Finally, the decoded blocks are checked with CRC.

Figure 10:
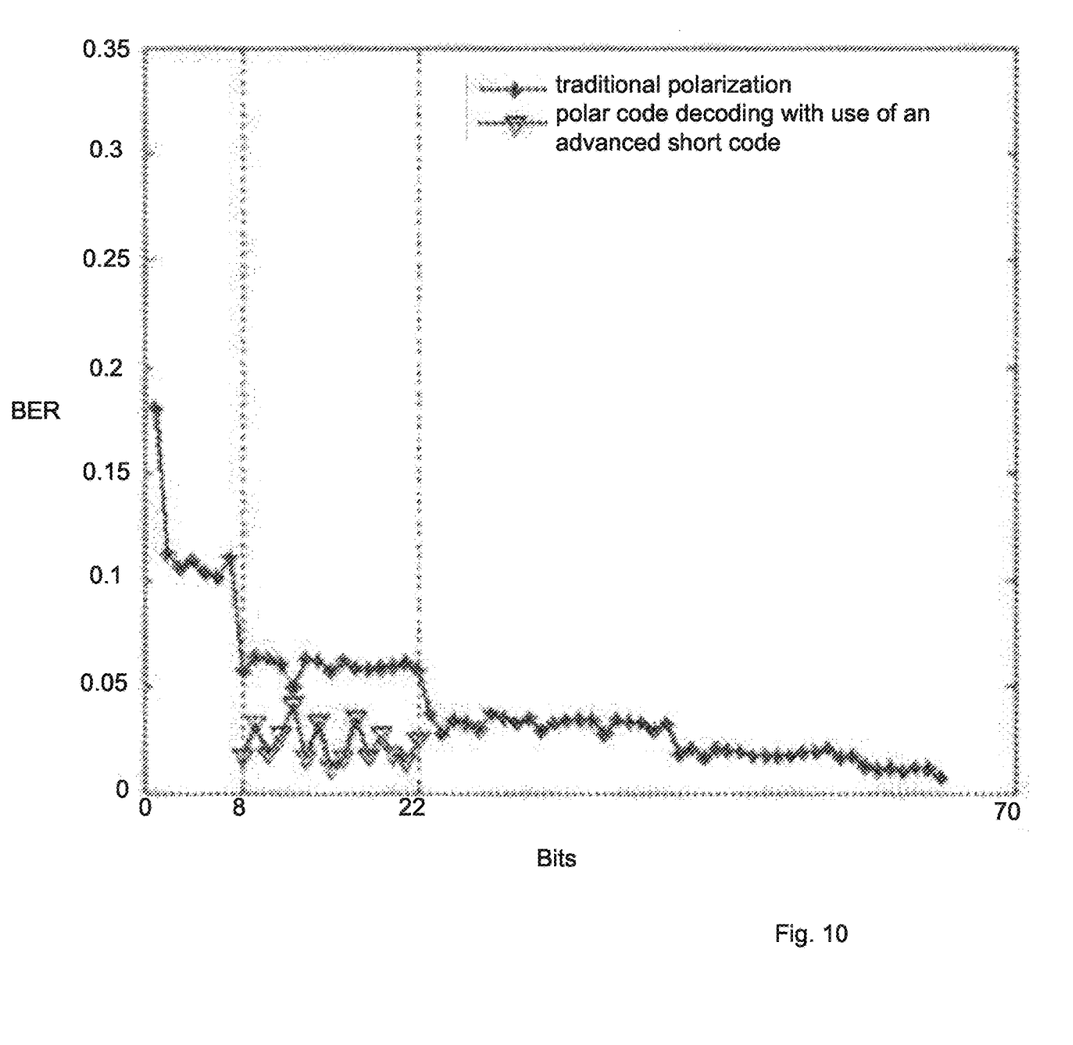
FIG. 10 is a schematic diagram of a simulation result of bit error rates of a scheme for coding and decoding polar codes according to an embodiment of the present disclosure.

FIG. 10 shows comparison results of bit error rates of a scheme for coding and decoding polar codes according to an embodiment of the present disclosure. It is seen that the BER of the repetition code is effectively reduced, similar to or even slightly lower than the BERs of the free bits. The simulation results show that the overall BLER is 0.1487, approximately the same compared to initially 0.1457 without the technique. This means the BLER performance is almost the same but more bits can be transmitted. This is the main benefit of the present disclosure. The BLER may be even lower if advanced short code is used.

Additionally, the encoding and decoding complexity of the repetition code is negligible compared with many other schemes.

Figure 5:
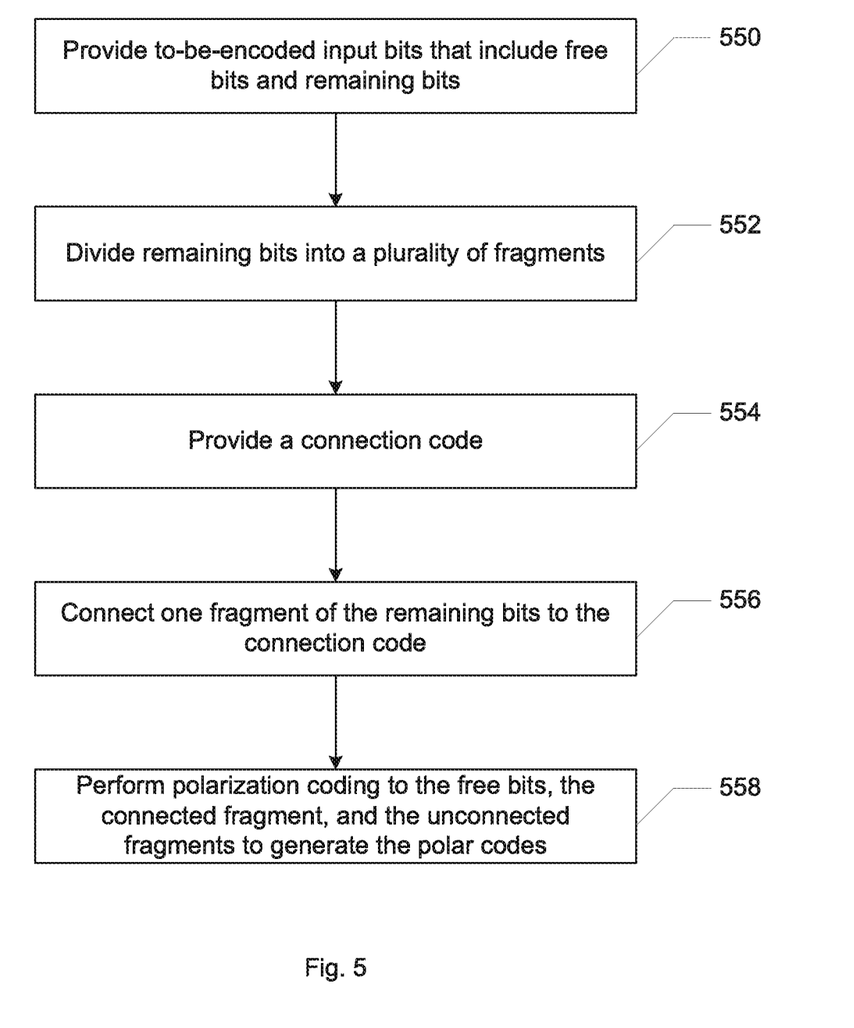
FIG. 5 is a flow diagram of a method for coding polar codes according to an embodiment of the present disclosure.

FIGS. 5-8 show schematic diagrams of a coding method, an encoder, a decoding method, and a decoder for implementing the ideas above, respectively. In the drawings, FIG. 5 is a flow diagram of a method for coding polar codes according to an embodiment of the present disclosure. In this example, the method comprises steps S50-S58. Particularly, to-be-coded input bits are provided, including free bits and remaining bits. In step S52, the remaining bits are split into a plurality of fractions. In step S54, a connection code is provided. In step S56, one fragment of the remaining bits is connected to the connection code, forming a connected fragment, while the remaining fragments are unconnected fragments. Finally, in step S58, the free bits, the connected fragment, and the unconnected fragments are subject to polarization coding, obtaining polar codes.

In one example, a length of the connection code is smaller than a total length of the input bits.

In one example, according to the coding method according to claim 1, in step S52, bit error rates of different bits in each fragment are substantially identical;

In one example, the connection code is configured to reduce the bit error rate of the fragment connected therewith, and the connection code does not need cyclic redundancy check.

In one example, the bit error rate of the connected fragment is no higher than a lowest bit error rate of the free bits.

Figure 6:
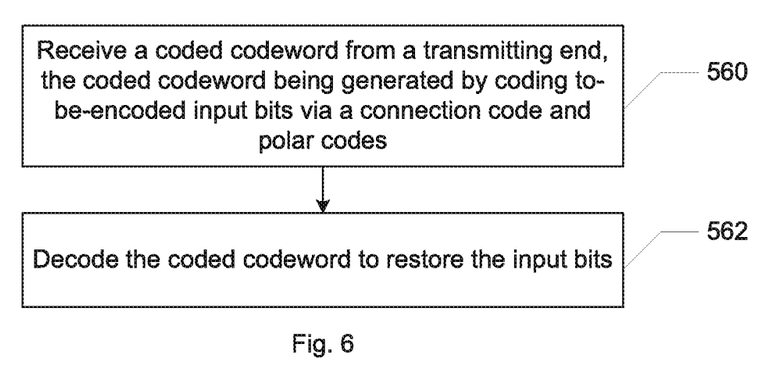
FIG. 6 is a flow diagram of a method for decoding polar codes according to an embodiment of the present disclosure.

FIG. 6 is a flow diagram of a method for decoding polar codes according to an embodiment of the present disclosure, comprising step S60 and S62. Particularly, in step S60, a coded codeword is received from a transmitting end, the coded codeword being generated by coding to-be-coded input bits via a connection code and polar codes; in step S62, the coded codeword is decoded to restore the input bits.

The method further comprises another step (not shown): receiving an indication from the transmitting end, the indication being for informing any one of the following items: whether the transmitting end uses the connection code to code the polar codes; how many fragments the remaining bits other than free bits in the input buts are divided at the transmitting end; whether each of the fragments is connected to the connection code; a type and relevant configuration parameters of the connection code; a code rate of the connection code; a composing/interleaving scheme of each fragment.

Figure 7:
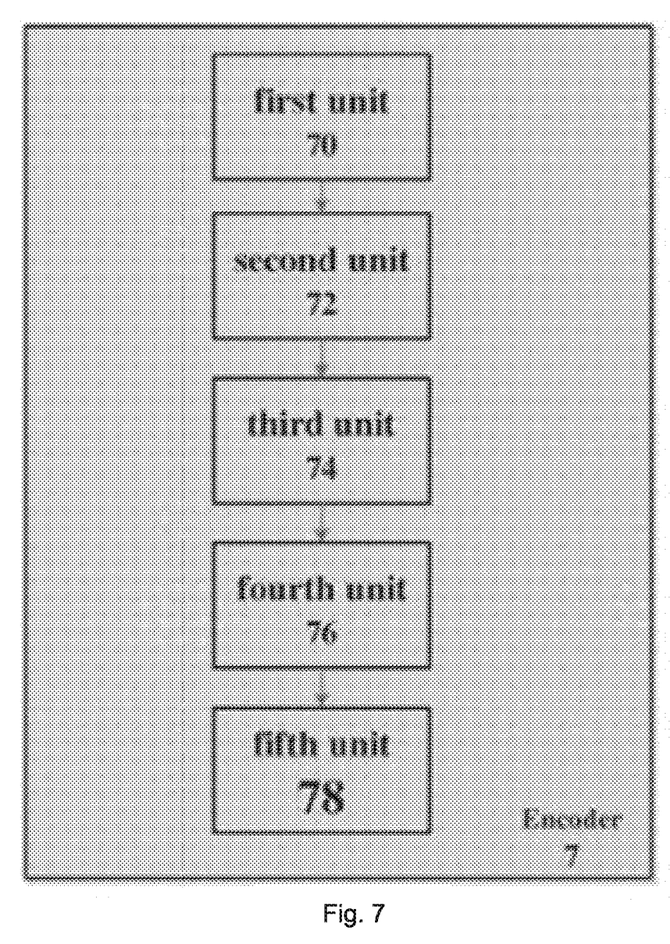
FIG. 7 is a block diagram of a polar code encoder according to an embodiment of the present disclosure.

FIG. 7 is a block diagram of a polar code encoder 7 according to an embodiment of the present disclosure, comprising: a first unit 70 configured to provide to-be-encoded input bits that include free bits and remaining bits; a second unit 72 configured to divide the remaining bits into a plurality of fragments; a third unit 73 configured to provide a connection code; a fourth unit 74 configured to connect one fragment of the remaining bits to the connection code to thereby form a connected fragment, while the remaining being still unconnected fragments; a fifth unit 75 configured to perform polarization coding to the free bits, the connected fragment, and the unconnected fragments to obtain the polar codes.

The unconnected fragments are set to a preset bit known to both transmitting and receiving parties upon polarization coding, e.g., 0.

In one example, a length of the connection code is smaller than a total length of the input bits.

In one example, bit error rates of different bits in each fragment are substantially identical.

In one example, the third unit 74 is configured to provide a plurality of different connection codes; and the fourth unit 76 is configured to connect a plurality of different connection codes with a plurality of different fragments of the remaining bits to form a plurality of connected fragments, while the remaining are unconnected fragment.

In one example, the connection codes are configured to reduce the bit error rate of the fragments connected therewith, and the connection codes need no cyclic redundancy check.

In one example, the bit error rate of any of the connected fragments is no higher than a lowest bit error rate of the free bits.

Figure 8:
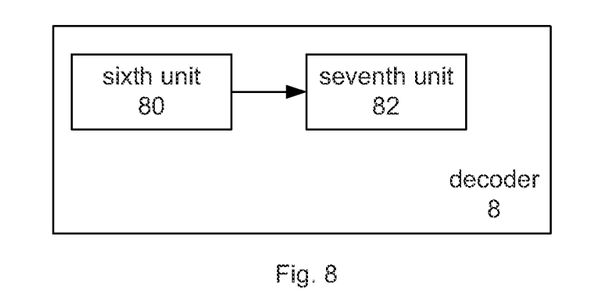
FIG. 8 is a block diagram of a polar code decoder according to an embodiment of the present disclosure.

FIG. 8 is a block diagram of a polar code decoder 8 according to an embodiment of the present disclosure, comprising: a sixth unit 80 configured to receive a coded codeword from a transmitting end, the coded codeword being generated by coding to-be-coded input bits via a connection code and the polar codes; and a seventh unit 80 configured to decode the coded codeword to restore the input bits.

In one example, the decoder further comprises: an eighth unit (not shown) configured to receive an indication from the transmitting end, the indication being for informing any one of the following items: whether the transmitting end uses a connection code to code the polar codes; how many fragments the remaining bits other than free bits in the input buts are divided at the transmitting end; whether each of the fragments is connected to the connection code; type and relevant configuration parameters of the connection code; code rate of the connection code; a composing/interleaving scheme of each fragment.

It should be noted that the present invention may be implemented in software and/or a combination of software and hardware. For example, each module of the present invention may be implemented by an application-specific integrated circuit (ASIC) or any other similar hardware device. In one embodiment, the software program of the present invention may be executed through a processor to implement the steps or functions as mentioned above. Likewise, the software program (including relevant data structure) of the present invention may be stored in a computer readable recording medium, e.g., RAM memory, magnetic or optic driver or soft floppy or similar devices. Additionally, some steps or functions of the present invention may be implemented by hardware, for example, a circuit cooperating with the processor so as to implement various steps of functions.

To those skilled in the art, it is apparent that the present invention is not limited to the details of the above exemplary embodiments, and the present invention may be implemented with other embodiments without departing from the spirit or basic features of the present invention. Thus, in any way, the embodiments should be regarded as exemplary, not limitative; the scope of the present invention is limited by the appended claims, instead of the above depiction. Thus, all variations intended to fall into the meaning and scope of equivalent elements of the claims should be covered within the present invention. No reference signs in the claims should be regarded as limiting the involved claims. Besides, it is apparent that the term "comprise" does not exclude other units or steps, and singularity does not exclude plurality. A plurality of units or modules stated in a system claim may also be implemented by a single unit or module through software or hardware. Terms such as the first and the second are used to indicate names, but do not indicate any particular sequence.

I claim:

1. A coding method for polar codes, comprising:
providing to-be-encoded input bits that include free bits and remaining bits;
dividing the remaining bits into a plurality of fragments;
providing a connection code comprising one or more bits;
connecting one fragment of the remaining bits to the connection code to thereby form a connected fragment, while the remaining bits being still unconnected fragments;
performing polarization coding to the free bits, the connected fragment, and the unconnected fragments to obtain the polar codes;
wherein a length of the fragment connected to the connection code is smaller than the free bits.

2. The coding method according to claim 1, wherein a length of the connection code is smaller than a total length of the input bits.

3. The coding method according to claim 1, wherein in the dividing, bit error rates of different bits in each fragment are substantially identical, the connection code is configured to reduce the bit error rate of the fragment connected therewith, and the connection code does not need cyclic redundancy check; optionally, the unconnected fragments are set to a preset bit known to both of transmitting and receiving parties upon polarization coding.

4. A decoding method for polar codes, comprising:
receiving a coded codeword from a transmitting end, the coded codeword being generated by coding to-be-coded input bits using a connection code comprising one or more bits and polar codes;
decoding the coded codeword to restore the input bits; and
receiving an indication from the transmitting end, the indication being for informing any one of the following items:
whether the transmitting end uses the connection code to code the polar codes;
how many fragments of remaining bits other than free bits in the input bits are divided at the transmitting end;
whether each of the fragments is connected to the connection code;
a type and relevant configuration parameters of the connection code;
a code rate of the connection code;
and a composing/interleaving scheme of each fragment.

5. An encoder for polar codes, comprising:
one or more processors configured to:
provide to-be-encoded input bits that include free bits and remaining bits;
divide the remaining bits into a plurality of fragments;
provide a connection code comprising one or more bits;
connect one fragment of the remaining bits to the connection code to thereby form a connected fragment, while the remaining bits being still unconnected fragments;
perform polarization coding to the free bits, the connected fragment, and the unconnected fragments to obtain the polar codes;

wherein a length of the fragment connected to the connection code is smaller than the free bits.

6. The encoder according to claim 5, wherein a length of the connection code is smaller than a total length of the input bits.

7. The encoder according to claim 5, wherein bit error rates of different bits in each fragment are substantially identical.

8. The encoder according to claim 5, wherein the one or more processors are further configured to:
provide a plurality of different connection codes; and
connect a plurality of different connection codes with a plurality of different fragments of the remaining bits to form a plurality of connected fragments, while the remaining bits are unconnected fragments, and wherein the connection codes are configured to reduce bit error rate of the fragments connected therewith, and the connection codes need no cyclic redundancy check; the unconnected fragments are set to a preset bit known to both of transmitting and receiving parties upon polarization coding.

9. A decoder for polar codes, comprising: one or more processors configured to:
receive a coded codeword from a transmitting end, the coded codeword being generated by coding to-be-coded input bits using a connection code comprising one or more bits and the polar codes;
decode the coded codeword to restore the input bits;
receive an indication from the transmitting end, the indication being for informing any one of the following items:
whether the transmitting end uses the connection code to code the polar codes;
how many fragments of remaining bits other than free bits in the input bits are divided at the transmitting end;
whether each of the fragments is connected to the connection code;
a type and relevant configuration parameters of the connection code;
a code rate of the connection code;
and a composing/interleaving scheme of each fragment.

* * * * *